(12) United States Patent
Foley et al.

(10) Patent No.: US 8,063,662 B2
(45) Date of Patent: Nov. 22, 2011

(54) METHODS AND APPARATUS FOR PREDICTABLE LEVEL SHIFTER POWER-UP STATE

(75) Inventors: David P. Foley, Chelmsford, MA (US); Hongxing Li, Tokyo (JP)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 12/217,563

(22) Filed: Jul. 7, 2008

(65) Prior Publication Data

US 2009/0027104 A1      Jan. 29, 2009

Related U.S. Application Data

(60) Provisional application No. 60/958,614, filed on Jul. 6, 2007, provisional application No. 60/958,778, filed on Jul. 9, 2007.

(51) Int. Cl.
*H03K 19/0175* (2006.01)
*H01L 5/00* (2006.01)

(52) U.S. Cl. ............... 326/63; 327/333; 326/80

(58) Field of Classification Search ........... 326/68, 326/83, 86, 87; 327/108, 109, 333
See application file for complete search history.

(56) References Cited

U.S. PATENT DOCUMENTS

| | | | |
|---|---|---|---|
| 5,418,477 A | 5/1995 | Dhong et al. | |
| 5,457,420 A | 10/1995 | Asada | |
| 6,043,699 A | 3/2000 | Shimizu | |
| 6,094,083 A * | 7/2000 | Noda | 327/333 |
| 6,373,285 B1 | 4/2002 | Konishi | |
| 6,414,534 B1 | 7/2002 | Wang et al. | |
| 6,489,828 B1 | 12/2002 | Wang et al. | |
| 6,556,061 B1 | 4/2003 | Chen et al. | |
| 6,650,168 B1 | 11/2003 | Wang et al. | |
| 6,781,413 B2 | 8/2004 | Kihara et al. | |
| 6,864,718 B2 * | 3/2005 | Yu | 326/68 |
| 6,894,537 B1 * | 5/2005 | Wert | 326/63 |
| 7,005,908 B2 | 2/2006 | Lee et al. | |
| 7,038,492 B2 * | 5/2006 | Wu et al. | 326/81 |
| 7,573,313 B2 | 8/2009 | Johansson et al. | |
| 2005/0184788 A1 | 8/2005 | Johansson et al. | |

OTHER PUBLICATIONS

Wang et al. "Level Shifters for High-speed 1-V to 3.3-V Interfaces in a 0.13-pm Cu-Interconnection/Low-k CMOS Technology," in *International Symposium on VLSI Technology, Systems, and Applications*, Apr. 18-20, 2001, pp. 307-310.

"Texas Instruments Translation Overview," Texas Instruments, Inc., 2003, pp. 1-4.

(Continued)

*Primary Examiner* — Shawki S Ismail
*Assistant Examiner* — Dylan White
(74) *Attorney, Agent, or Firm* — Kenyon & Kenyon LLP

(57) ABSTRACT

In one aspect, a level shifter for shifting a voltage level from a first voltage level to a second voltage level and having a predictable power-up state is provided. The level shifter comprises a first input and a second input forming a differential input to receive signals at the first voltage level, a first output and a second output forming a differential output to provide output signals at the second voltage level, and at least one circuit element coupled between the differential input and the differential output to pull the first output to a lower voltage level than the second output during power-up so that the level shifter powers-up in a desired state.

18 Claims, 8 Drawing Sheets

OTHER PUBLICATIONS

"Voltage Level Translating Circuit," IBM Technical Disclosure Bulletin, Oct. 1959, 1 page.

"Voltage Level Translation Circuit," IBM Technical Disclosure Bulletin, Jun. 1975, 2 pages.

Rakes, "Circuit Circus," Popular Electronics, Mar. 1999, pp. 59-62.

"Cascaded Common-Gate FET IC Provides Flexible Level Translation," Electronic Design, Penton Media, Inc., Jul. 10, 2000, 1 page.

* cited by examiner

METHODS AND APPARATUS FOR PREDICTABLE LEVEL SHIFTER POWER-UP STATE

RELATED APPLICATIONS

This application claims priority under 35 U.S.C. §119(e) to U.S. Provisional Application Ser. No. 60/958,614, entitled "TILTED LOGIC CIRCUITS," filed on Jul. 6, 2007, and U.S. Provisional Application Ser. No. 60/958,778, entitled "TILTED LOGIC CIRCUITS," filed on Jul. 9, 2007, each of which is herein incorporated by reference in its entirety.

FIELD OF THE INVENTION

The present invention relates to level shifters and, more particularly, to transient behavior of level shifters during power-up.

BACKGROUND OF THE INVENTION

The proper functioning of many electronic circuits involves shifting a digital signal from one voltage level to another. For example, an internal digital logic signal may need to be converted to a higher voltage level I/O signal to allow proper communication with external circuits and/or devices. However, there are numerous circumstances in which level shifting may be required to ensure that signals are of the appropriate voltage when traveling between different circuits, or different portions of a single circuit. A circuit which performs this function is herein referred to as a "level shifter."

A schematic of a conventional level shifter circuit is illustrated FIG. 1. Level shifter 100 includes differential inputs 110a and 110b arranged to receive differential digital logic input signals in+ and in−, respectively. The voltage levels received at in+ and in− are either in a low state at ground (GND) or a high state of VDD1. The differential inputs may be formed from transistor devices, for example, NMOS devices N1 and N2, connected between ground and differential outputs 120a and 120b, which respectively provide differential digital logic output signals out+ and out−.

Further transistor elements, for example, PMOS devices P1 and P2 may be connected between VDD2 and differential outputs and having their respective gates cross-coupled to the opposing differential output. Thus, the voltage levels of differential digital logic output signals out+ and out− are either in a low state of GND or a high state of VDD2. For a level shifter that shifts voltage levels at the input to higher voltage levels at the outputs, VDD2 is greater than VDD1. For example, VDD1 may be the relatively low voltage level of internal logic voltages and VDD2 may be the relatively high voltage level of an external circuit or device.

As discussed above, level shifters are commonly used to shift internal logic signals to higher levels appropriate for I/O signals, for example, at I/O pads designed to interface with external circuits, devices or chips. FIG. 2A illustrates an output channel of a integrated circuit adapted to provide an internal logic signal to an output pad at voltage levels required for a particular I/O interface. Output channel 200 includes an output pad OUT 210 at which an external circuit or device may connect to receive I/O signals from the integrated circuit. OUT 210 is connected to a low voltage source (VL), a mid-level voltage source (VM, which may be ground) and a high level voltage source (VH) via switches 225, 235 and 245, respectively. Ultimately, which of these voltage levels is provided to OUT 210 depends on level shifters 220, 230 and 240, as discussed in further detail below.

Level shifters 220, 230 and 240 are schematically shown, and each may be similar to the level shifter illustrated in FIG. 1. Specifically, the in+ and in− connections in each of the level shifters in FIG. 2A may correspond to the IN+ and IN− connections illustrated in FIG. 1 and are arranged to receive the internal signals from the integrated circuit. As discussed above, these signals may be internal logic signals generated by the integrated circuit and are typically at a low voltage level relative to the voltage levels required at the output pad OUT 210. Similarly, the out+ and out− connections illustrated in FIG. 2A may correspond to OUT+ and OUT− in FIG. 1, and are arranged to provide voltage levels shifted up from the voltage levels received at the inputs. The out+connection of the level shifters 220, 230 and 240 are coupled to the switches 225, 235 and 245, respectively, to control which voltage level VL, VM or VH is provided at the output pad OUT 210. For example, when level shifter 240 generates a high level voltage at out+, switch 245 is turned on and the high voltage VH is provided at OUT 210. Similarly, when level shifter 220 generates a high level voltage at out+, switch 225 is turned on and the low voltage VL is provided at OUT 210.

Thus, output channel 200 implements a voltage level shift from relatively low internal voltage levels to relatively high voltage levels appropriate for a particular I/O application. It should be appreciated that an integrated circuit may include multiple output channels. For example, FIG. 2B illustrates an integrated circuit 250 that has a multiple output pads 210'. Each output pad may be connected as illustrated in FIG. 2A to level shifters to form an N-channel I/O interface to external (e.g., off-chip) circuits or devices. In the example illustrated in FIG. 1A, only a single level shifter is provided for each voltage level in output channel 200. However, multiple level shifters may be provided in series to obtain increased voltage level shifting to accommodate I/O interfaces where significant level shifting may be required. For example, the output connections of one level shifter may be provided to the input connections of another level shifter to achieve an intermediate voltage level. This configuration may be repeated until the desired voltage level increase is achieved.

SUMMARY OF THE INVENTION

Applicant has appreciated that it a level shifter having a known power-up state may be advantageous in the design of many circuit. Some embodiments include a level shifter for shifting a voltage level from a first voltage level to a second voltage level and having a predictable power-up state, the level shifter comprising a first input and a second input forming a differential input to receive signals at the first voltage level a first output and a second output forming a differential output to provide output signals at the second voltage level, and at least one circuit element coupled between the differential input and the differential output to pull the first output to a lower voltage level than the second output during power-up so that the level shifter powers-up in a desired state.

Some embodiments include a method powering-up a level shifter for shifting a voltage level from a first voltage level to a second voltage level, the level shifter having a first input and a second input forming a differential input to receive signals at the first voltage level, and a first output and a second output forming a differential output to provide output signals at the second voltage level, the method comprising, during power-up, pulling the first output to a lower voltage level than the second output so that the level shifter powers-up in a desired state.

Some embodiments include an input/output (I/O) interface of an integrated circuit having a reduced inrush current, the I/O interface configured to provide internal signals of the integrated circuit to at least one circuit external to the integrated circuit at voltage levels associated with the at least one external circuit, the I/O interface comprising a plurality of I/O channels, each adapted to provide a respective internal signal at first voltage levels to the I/O interface at second voltage levels, each of the plurality of I/O channels comprising an I/O connection at which the at least one external circuit may connect to the respective I/O channel to receive signals at the second voltage levels, at least one level shifter coupled to the I/O connection, the at least one level shifter including a first input and a second input forming a differential input to receive signals at the first voltage levels, and a first output and a second output forming a differential output to provide output signals at the second voltage levels to the I/O connection, the at least one level shifter further comprising at least one circuit element coupled between the differential input and the differential output to pull the first output to a lower voltage level than the second output during power-up so that the level shifter powers-up in a desired state. In some embodiments, each of the plurality of I/O channels includes a plurality of level shifters, each of the plurality of level shifters being coupled to the respective I/O connection through a respective switch such that when the respective level shifter is in a high level state, the switch is turned on and when the respective level shifter is in a low level state, the switch is turned off, and wherein the at least one circuit element of each of the plurality of level-shifters of each of the plurality of I/O channels is configured such that no two switches at any one of the plurality of I/O channels is on simultaneously during power-up.

DETAILED DESCRIPTION

Level shifters are bistable circuits and will either be in a low level state or a high level state at the output of the level shifter. During normal operation, this bistability is not typically problematic as the output will change states, as desired, in response to changes at the input because the voltage levels of the level shifter are powered-up to maximum. However, Applicant has recognized that during power-up, conventional level shifters will assume one of the two states in an unpredictable manner. That is, conventional level shifters may not be predictably powered up in one state or the other. This unpredictability can cause certain circuits to operate erroneously during power-up. To avoid at least some power-up errors, Applicant has developed a level shifter that can be reliably powered-up in a desired state. That is, level shifters according to aspects of the present invention may be selected to power-up in a desired one of the two stable states of the level shifter.

In some embodiments, an asymmetric level shifter is provided that tilts the level shifter towards the desired state during power-up. For example, at least one circuit element may be added to the signal path of the level shifter such that the output of the level shifter tends towards the desired state. In some embodiments, an alternating current (AC) circuit element (e.g., a capacitor) is used to either pull up or pull down the voltage level of one of the differential outputs relative to the other depending on which power-up state is desired. In other embodiments, a direct current (DC) circuit element (e.g., a transistor or resistor) is used to tilt the level shifter towards a desired state during power-up.

Following below are more detailed descriptions of various concepts related to, and embodiments of, methods and apparatus according to the present invention. It should be appreciated that various aspects of the inventions described herein may be implemented in any of numerous ways and/or in any combination. Examples of specific implementations are provided herein for illustrative purposes only.

Figure 1:
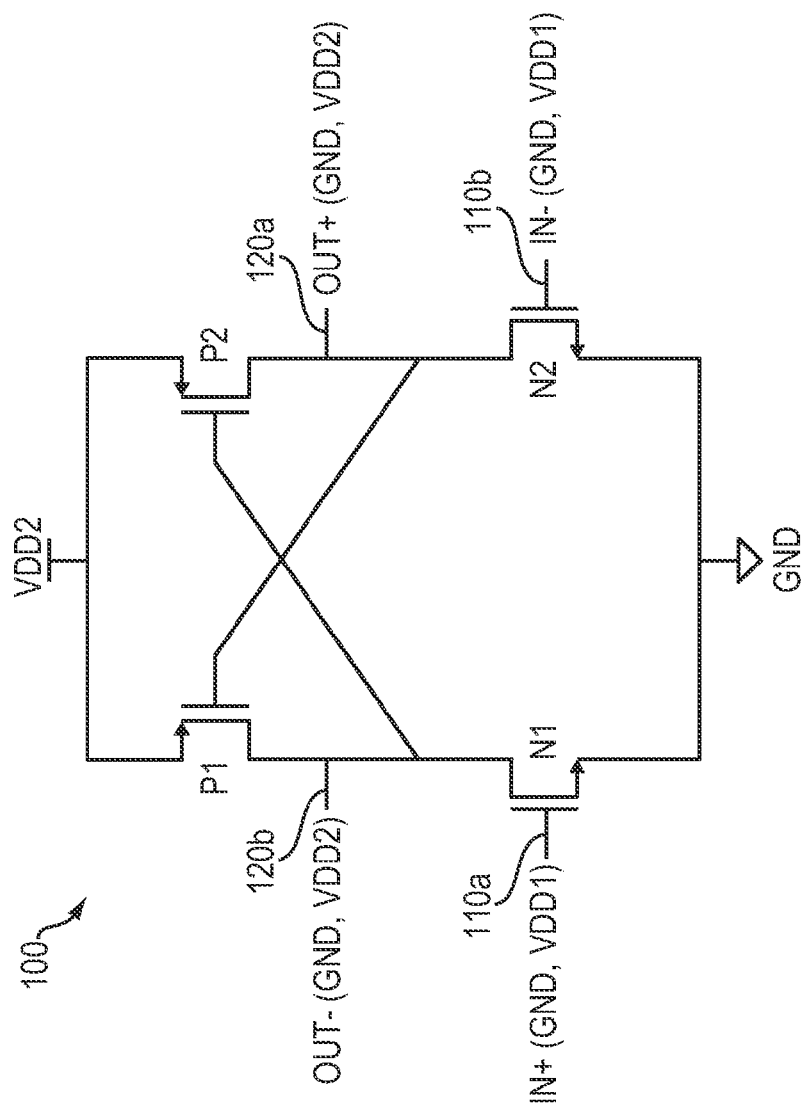
FIG. 1 illustrates a conventional level shifter.

As discussed above, conventional level shifters may cause erroneous circuit behavior to occur during power-up as a result of the unpredictability of the state of the level shifter during power-up. This problem is described in connection with the conventional level shifter shown in FIG. 1. The power-up interval is defined as the time from when VDD1 and VDD2 are first turned on to the time they reach their final voltage level. When the VDD2 voltage supply is turned on before the VDD1 voltage supply is turned on, the output signal cannot be predicted, and will assume one of two different digital outputs depending on the characteristics of the transistors forming the various components of the level shifter.

Figure 3:
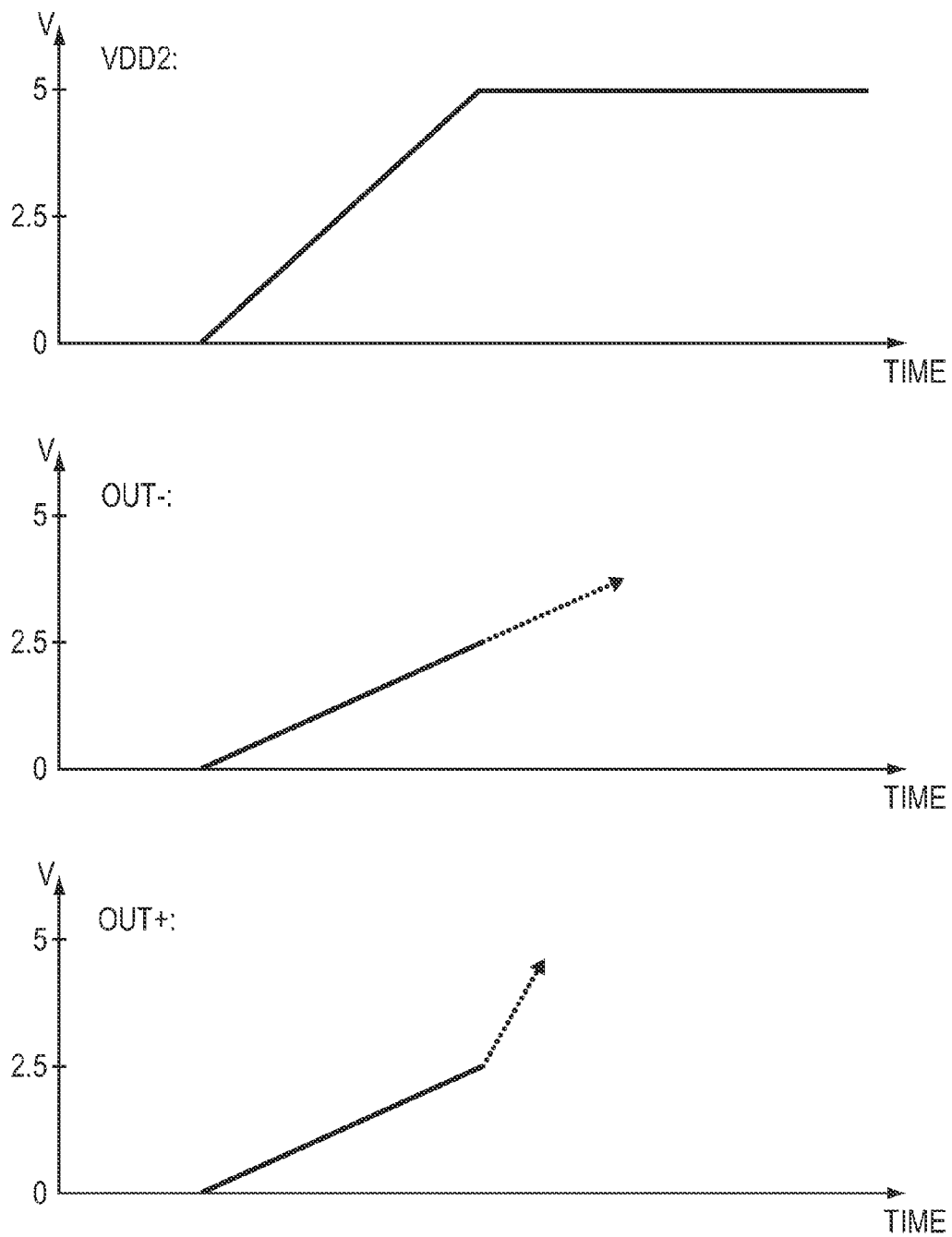
FIG. 3 illustrates a failure condition due to unpredictable power-up states of a level shifter.

FIG. 3 illustrates one situation in which the unpredictability of the level shifter power-up state may become problematic. After being turned on, the supply voltage VDD2 will rise from ground to its full potential (which is shown as 5 V in the example of FIG. 3, but may be of any desired voltage). The outputs out+ and out− will also rise towards VDD2. However, one of outputs (in this case, out+) will begin to rise more quickly towards VDD2 and eventually track VDD2. The output signals may behave differently because of an imbalance in the transistors that causes one to conduct more. For example, during fabrication of the circuit, there may be a mismatch between the threshold voltages of the transistor elements forming output connections out+ and out−. Imbalances may result from numerous other factors such as systemic mismatches, parasitic capacitance mismatches, and noise mismatches.

The result of such mismatches may be problematic when a circuit that receives the output from the level shifter is expecting the level shifter to power-up in a different state. For example, if it is assumed in FIG. 3 that the state of out+ should be low for proper operation of a circuit that receives out+ (e.g., if out+ is used as an input to another level shifting circuit or as the gate control to a switch mechanism at an I/O pad), then the output signals shown in FIG. 3 result in a failure condition, because out− is erroneously the lower signal and the level shifter will therefore power-up in the high level state.

As an example, the unpredictability of the state of a level shifter during power-up may result in deleterious effects in the output channel circuit 200 described in connection with FIG. 2A. As discussed above, level shifters are often used to drive I/O signals from an integrated circuit off-chip as illustrated by the 18 channel I/O driver illustrated in FIG. 2B. As discussed above, the I/O interface allows external circuits and/or devices to interface with an integrated circuit that has its own internal voltage levels. The unpredictably of level shifter power-up states may lead to erroneous operation of the devices connected to the I/O pads. In particular, certain combinations of power-up states may result in inrush currents that are in excess of the maximum permissible inrush currents for circuits or devices connected at the I/O pads, as discussed in further detail below. Inrush current or input surge current refers to the maximum, instantaneous input current drawn by an electrical device when the device is powered-up.

Figure 2A:
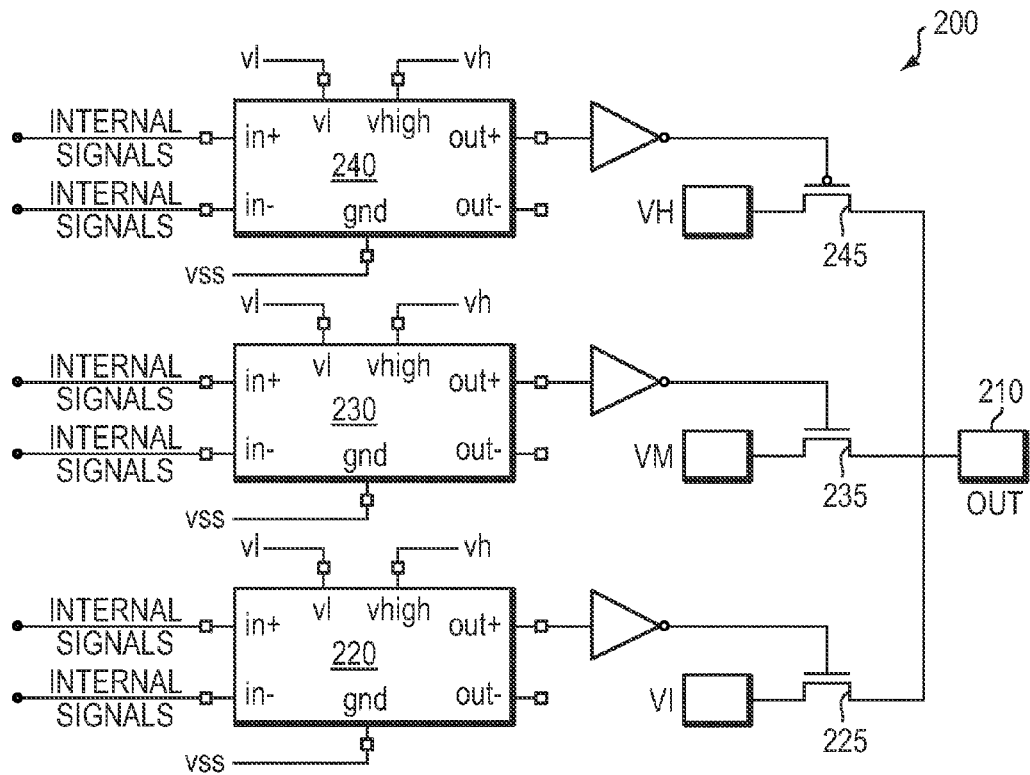
FIG. 2A illustrates an output channel of an I/O interface.
Figure 2B:
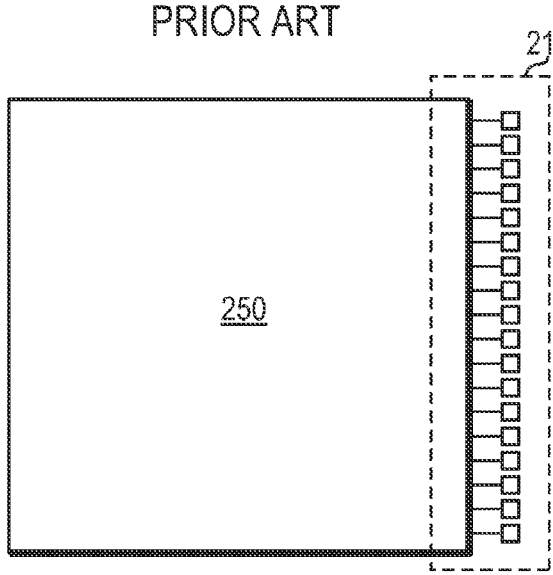
FIG. 2B illustrates an I/O interface of an integrated circuit.

Referring back to the single output channel in FIG. 2A. Because the power-up state of the levels shifters 220, 230 and 240 is generally unknown, there is a probability that more than one of the switches connected to OUT 210 will be turned on by the corresponding level shifters should the level shifters power-up in the high level state. Circumstances in which multiple switches are turned on during power-up can result in short circuit conditions at the output pad resulting in relatively large inrush currents, particularly, when multiple I/O pads experience the short circuit condition as a result of erroneous power-up states. The cumulative effect of this may result in an inrush current to the connected device that is above the expected values causing the connected device to operate erroneously, or worse yet, cease to function at all.

To avoid the inrush problem and/or other problems associated with unpredictable power-up states, Applicant has developed a level shifting circuit having a known power-up state. According to some embodiments, the level shifting circuit is unbalanced using at least one circuit element in the signal path of the level shifter so as to cause one of the outputs of the level shifting circuit to be pulled higher or lower than the other output of the level shifting circuit, based on a desired state of the level shifting circuit on power-up. The circuit element is arranged to effectively tilt the level shifting circuit toward the desired state.

FIG. 4 illustrates an asymmetric level shifter having a known power-up state, in accordance with some embodiments of the present invention. Asymmetric level shifting circuit 400 may be similar in many respects to the level shifting circuit illustrated in FIG. 1. In particular, level shifting circuit 400 includes differential inputs 410a and 410b to receive internal signals of a relatively low voltage level (VDD1) and differential outputs 420a and 420b to provide output signals of a relatively high voltage level (VDD2). Thus, a level shifting signal path is formed between the differential inputs and differential outputs that translate the relatively low voltage level to a relatively high voltage level. However, level shifter 400 also includes a capacitor 475 connected between the output connection 420a and the relatively low voltage level VDD1 (i.e., in the signal path of the level shifter) to pull down the voltage at out+. While capacitor 475 is shown as connected between the output connection and VDD1, the capacitor could also be connected between output connection 420a and ground or some other voltage source that is low relative to VDD2.

Assume for example that, absent capacitor 475, level shifter 400 has the systematic mismatch of level shifter 100. Assuming also that out+ should be low during power-up for proper operation of the circuit, the circuit will tend to power-up in the incorrect state, which may result in a failure condition or erroneous operation of circuits and/or devices connected to the output of the level shifter. With the addition of capacitor 475, out+ is pulled lower as a result of the increased capacitance between out+ and VDD1 (or ground). That is, the capacitor must be charged up before out+ can switch into the high state. Thus, out+ will be pulled low and the level shifter will power-up in the desired state. The capacitor may be selected to have a capacitance that counterbalances the effect of the mismatch and tilts the level shifter in the direction of the correct power-up state (e.g., out+ being in a low state on power-up). As an example, assume that the initial imbalance was due to a mismatch between parasitic capacitances on the differential outputs with a parasitic capacitance of 60 fF on out− and a parasitic capacitance of 50 fF on out+. Thus, out− tends to be pulled lower than out+ during power-up, causing a potential failure condition. To avoid powering-up in this generally undesirable state, the capacitor may be selected to have a capacitance of higher than 10 fF to overcome the initial mismatch and tilt the level shifter to a low state on out+ on power-up as desired.

As discussed above, however, mismatches may be caused by a number of factors (e.g., systemic mismatches, parasitic capacitance mismatches, and noise mismatches) that are not always easy to quantify. Indeed, it may not be desirable to attempt to determine a direction of an imbalance or quantify the mismatch. Thus, the capacitance may be selected to comfortably overcome any possible or likely mismatch to tilt the circuit in the desired direction. For example, the capacitance may be selected to be 100 fF, which will increase the capacitance on out+ by 200%. Thus, even where the mismatch is unknown or not precisely known, the balance may still be skewed in the desired direction during power-up.

Figure 4A:
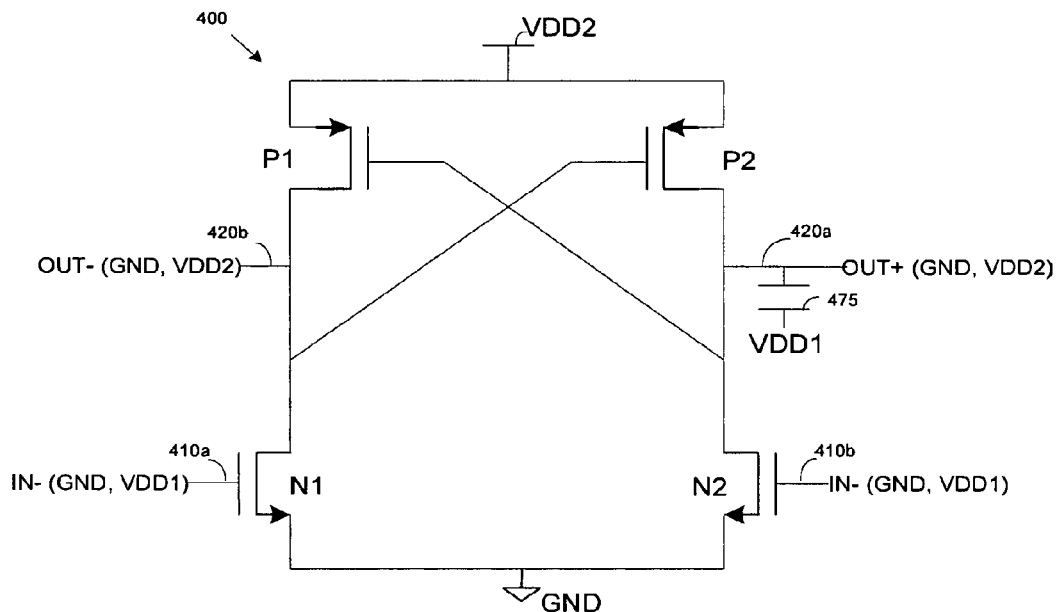
FIGS. 4A and 4B illustrate asymmetric level shifters having known power-up states, in accordance with some embodiments of the present invention.
Figure 4B:
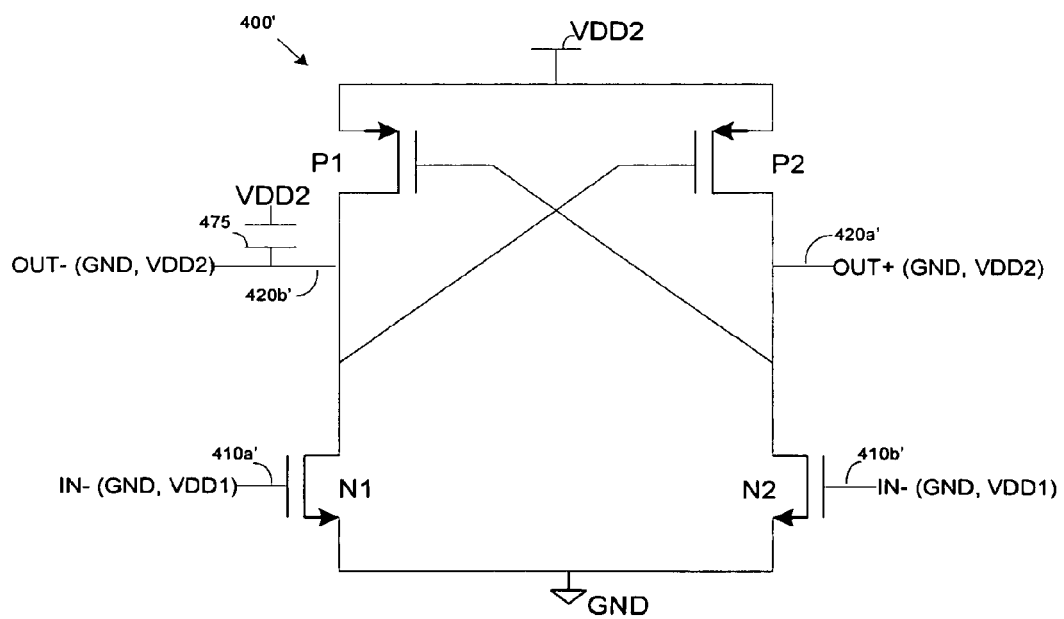

FIG. 4B illustrates an alternative configuration. Rather than pulling out+ down, out− may be pulled up to a level higher than out+ to tilt out+ into the low state during power-up. The configuration in 4B has the same effect as the configuration in FIG. 4A. In addition, capacitor elements may be added to both pull up out− and pull down out+, as the aspects of the invention are not limited in this respect. By adding capacitance elements to both output, less capacitance may be needed on each capacitor which may have benefits in designing the level shifter. Other configurations may be used as well, as the aspects of the invention are not limited in this respect.

The many different configurations that implement a suitable asymmetric level shifter allow much flexibility with respect to designing a solution for a particular implementation, integrated circuit layout, fabrication technique, etc. It should be appreciated that the configurations illustrated in FIGS. 4A and 4B illustrate asymmetrical level shifters designed to ensure that the level shifter powers-up with out+ in the low level state. The desired state, however, may be out+ in a high level state, in which case, the capacitor element configurations illustrated in FIGS. 4A and 4B may be switched to tilt the level switch toward the desired high level state on power-up.

Due to the fact that a capacitor is an AC element, the capacitor implementation may only be effective when the voltage levels of the level shifting are ramping up at an appreciable rate. That is, because the current through a capacitor is related to the capacitance and the rate of change of the voltage across the capacitor, the capacitor will only draw current in response to a voltage change. This constraint is typically not problematic as power-up conditions result in voltage ramp-up rates that far exceed those required by the capacitor solution. However, there are conceivable circumstances wherein a power-up interval is significantly long and the voltage ramp-up is slow enough to cause the capacitor solution to be ineffective.

An alternative solution that does not have this constraint involves replacing the AC circuit element (e.g., the capacitor) with a DC circuit element such as a resistor or a transistor.

Figure 5A:
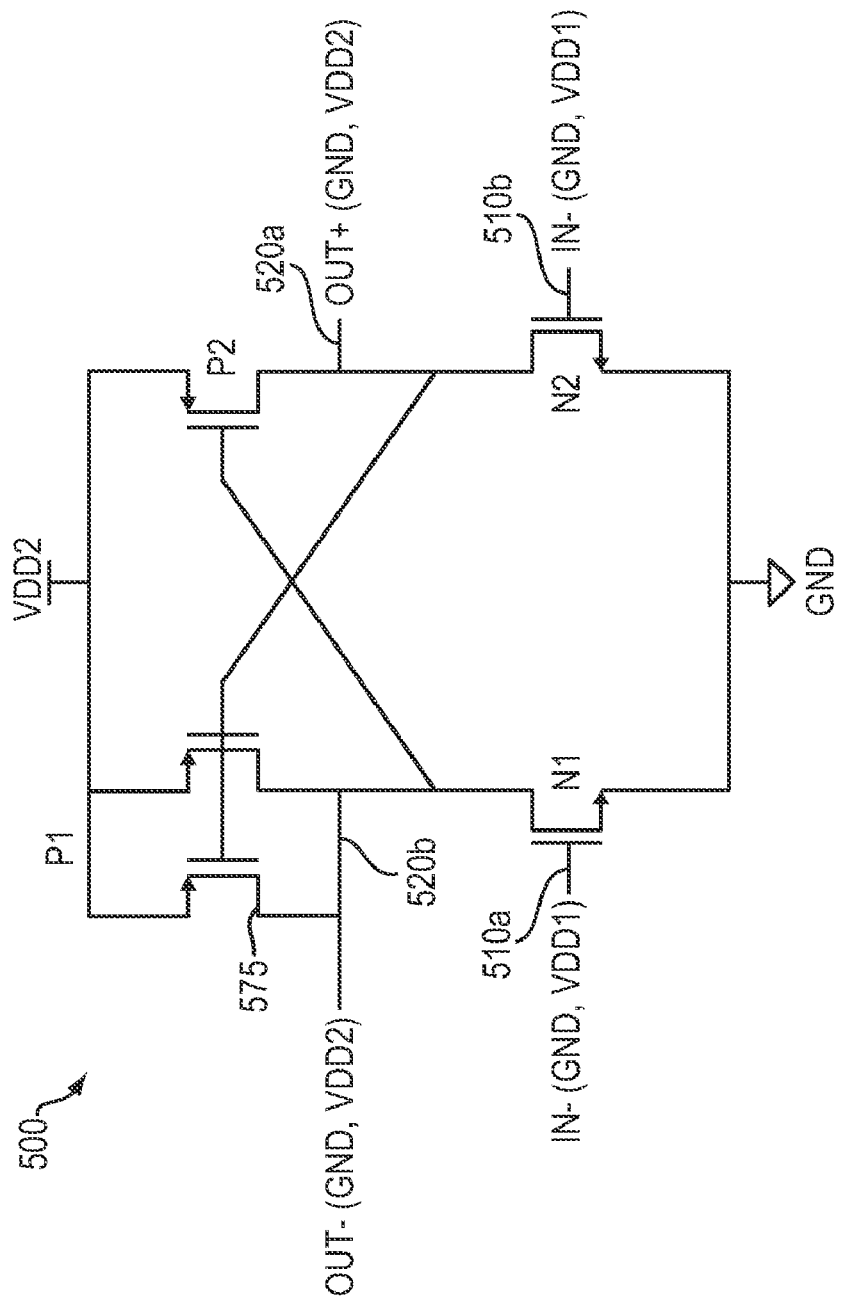
FIGS. 5A and 5B illustrates alternative asymmetric level shifters having known power-up states in accordance with some embodiments of the present invention.
Figure 5B:
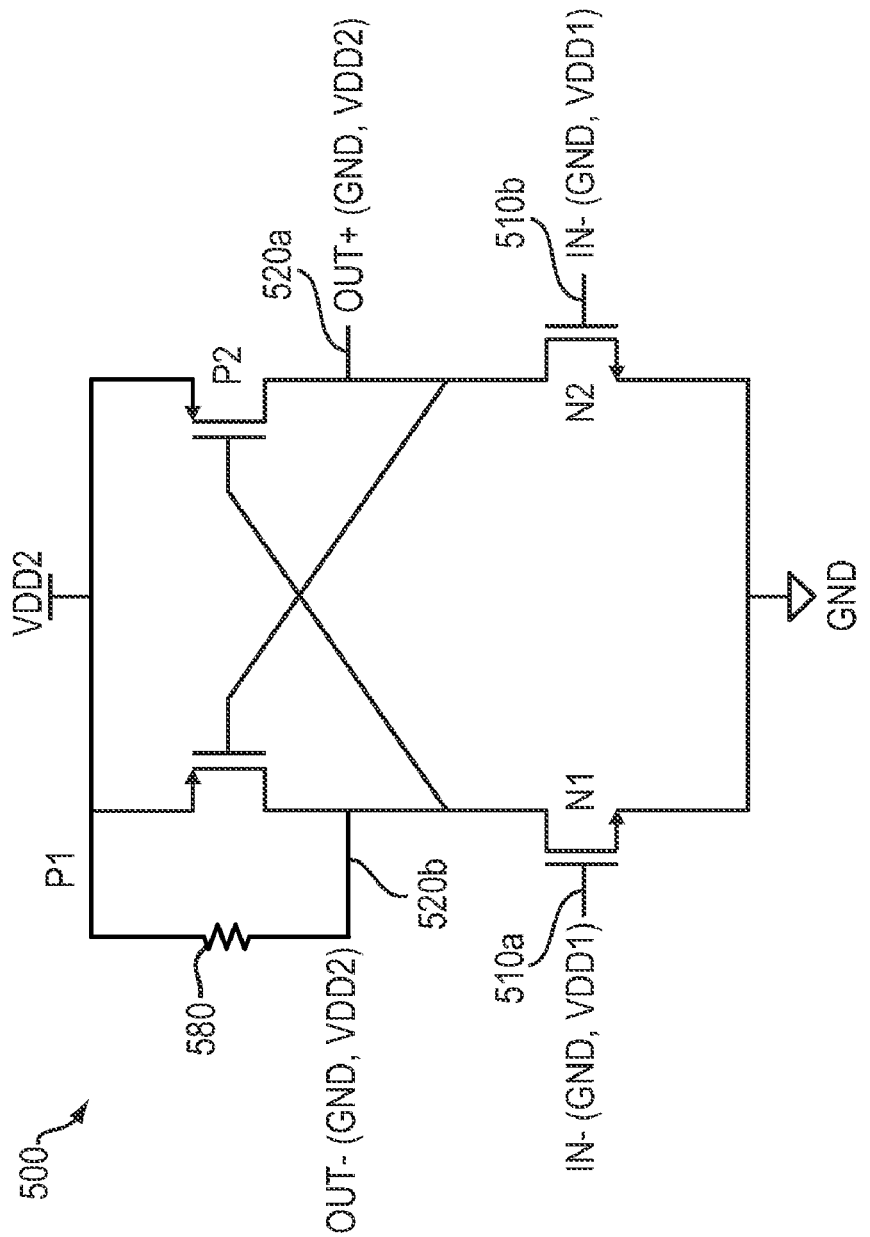

FIGS. 5A and 5B illustrate asymmetric level shifters using DC circuit elements to tilt the level shifter in the desired direction, in accordance with some embodiments of the present invention. FIGS. 5A and 5B may be similar to the level shifters illustrated in FIGS. 4A and 4B, except that instead of tilting the level shifter using a capacitor, a transistor element 575 or a resistor element 580 is connected between out− and VDD2 to tilt the level shifter in the direction of a low state at out+ during power-up. Additional capacitance in parallel with transistor P1 will cause the transistor P1 to be pulled higher than P2 causing out− to be pulled higher and causing out+ to be pulled lower. Thus, the transistor implementation has the same effect as the capacitor solution. Because the transistor element draws DC current, the transistor solution will operate correctly even at very slow rates of power-up. It should be appreciated that the transistor element may be replaced with a resistor as well to either pull up or pull down the voltage as desired to tilt the level shifter.

Figure 6:
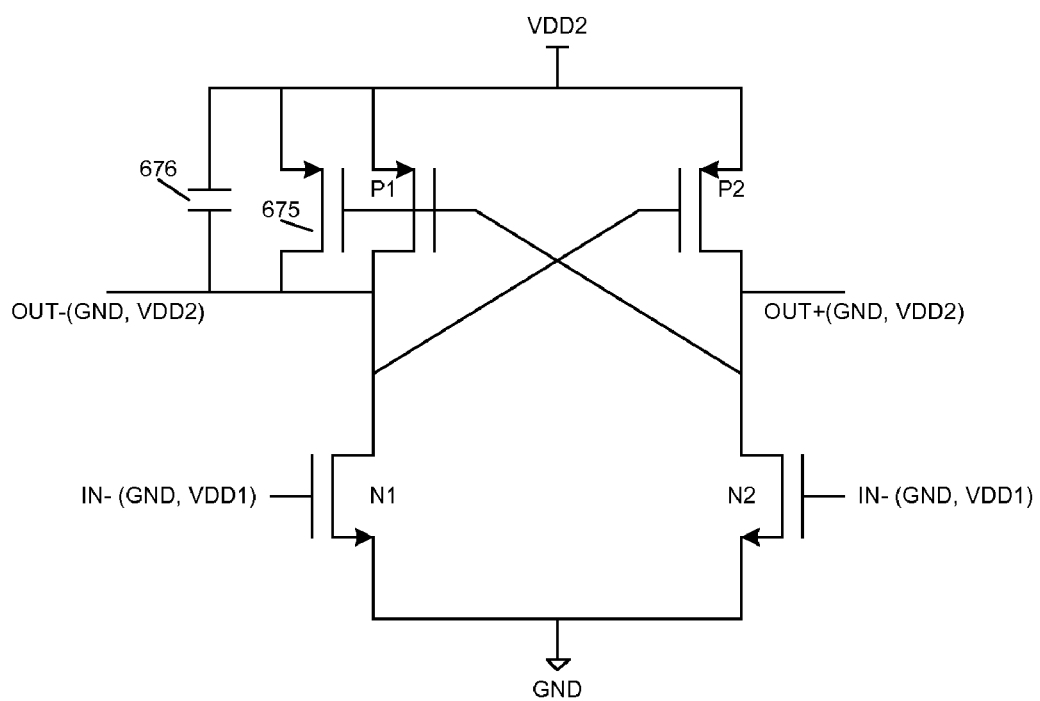
FIG. 6 illustrates an alternative asymmetric level shifter having a known power-up state, in accordance with some embodiments of the present invention.
Figure 7A:
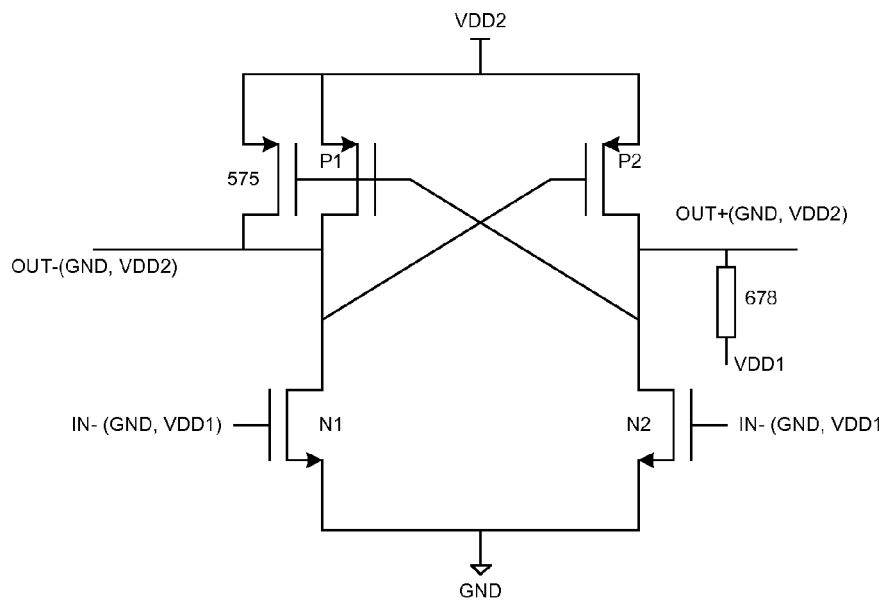
FIGS. 7A-7B illustrate alternative asymmetric level shifters having a known power-up state, in accordance with some embodiments of the present invention.
Figure 7B:
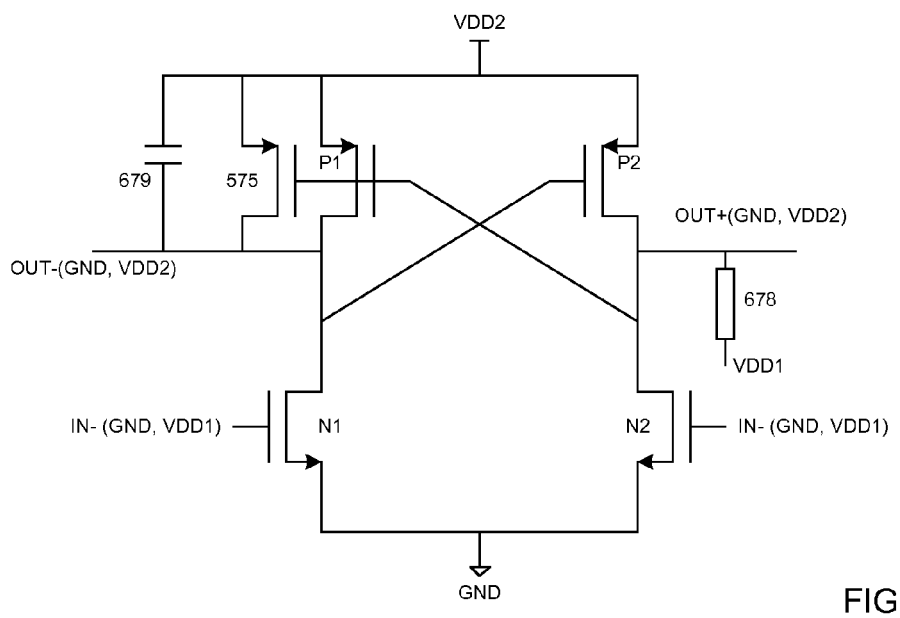

It should be appreciated that the locations of the capacitors in FIGS. 4A and 4B and the transistor in FIG. 5 are merely exemplary, and that the circuits may be imbalanced in any number of suitable ways. For example, the elements may be used in connection with the input transistors rather than the output transistors. Further, the nature of the elements is merely exemplary. Other elements with capacitance may alternatively be used. Further, various combination of such elements (e.g., any combination of capacitors, transistors and/or resistors) may be used, as the aspects of the invention are not limited in this respect. For example, FIG. 6 illustrates a circuit further including a pull-up transistor 675 and a pull-up capacitor 676 both connected between an output and VDD2 to pull up the output. FIG. 7A illustrates a circuit including a pull-down resistor 678 connected between a first output and VDD1 to pull down the first output, while transistor 575 is connected between VDD2 and a second output to pull up the second output. FIG. 7B illustrates a circuit including a pull-down resistor 678 connected between a first output and VDD1 to pull down the first output, while transistor 575 and capacitor 679 are connected between VDD2 and a second output to the second output.

The above-described embodiments of the present invention can be implemented in any of numerous ways. For example, the embodiments may be implemented using hardware, software or a combination thereof. It should be appreciated that any component or collection of components that perform the functions described above can be generically considered as one or more controllers that control the above-discussed function. The one or more controller can be implemented in numerous ways, such as with dedicated hardware, circuitry or with general purpose hardware (e.g., one or more processor) that is programmed using microcode or software to perform the functions recited above.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. The invention is capable of other embodiments and of being practiced or of being carried out in various ways.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing", "involving", and variations thereof herein, is meant to encompass the items listed thereafter and equivalents thereof as well as additional items.

What is claimed is:

1. A level shifter for shifting a voltage level from a first voltage level to a second voltage level and having a predictable power-up state, the level shifter comprising:
   a first input and a second input forming a differential input to receive signals at the first voltage level;
   a first output and a second output forming a differential output to provide output signals at the second voltage level; and
   a capacitor coupled between the second output and the second voltage level to pull up the voltage level at the second output.

2. The level shifter of claim 1 further comprising a capacitor connected between the first output and a voltage level less than the second voltage level to pull down the voltage level at the first output.

3. The level shifter of claim 1 further comprising a resistor connected between the second output and the second voltage level to pull up the voltage level at the second output.

4. The level shifter of claim 1, wherein the first output is a positive output of the differential output such that the level shifter powers-up in a low level state.

5. The level shifter of claim 1, wherein the first output is a negative output of the differential output such that the level shifter powers-up in a high level state.

6. The level shifter of claim 1, wherein the capacitor includes a first end coupled to the second output and a second end coupled to the second voltage level.

7. A level shifter for shifting a voltage level from a first voltage level to a second voltage level and having a predictable power-up state, the level shifter comprising:
   a first input and a second input forming a differential input to receive signals at the first voltage level;
   a first output and a second output forming a differential output to provide output signals at the second voltage level;
   a transistor coupled between the second output and the second voltage level to pull up the voltage level at the second output; and
   a first capacitor connected between the first output and a voltage level less than the second voltage level to pull down the voltage level at the first output and a second capacitor connected between the second output and the second voltage level to pull up the voltage level at the second output.

8. A level shifter for shifting a voltage level from a first voltage level to a second voltage level and having a predictable power-up state, the level shifter comprising:
   a first input and a second input forming a differential input to receive signals at the first voltage level;
   a first output and a second output forming a differential output to provide output signals at the second voltage level;
   at least one capacitor or transistor coupled between the second output and the second voltage level to pull up the voltage level at the second output; and
   a transistor connected between the first output and a voltage level less than the second voltage level to pull down the voltage level at the first output.

9. A level shifter for shifting a voltage level from a first voltage level to a second voltage level and having a predictable power-up state, the level shifter comprising:
- a first input and a second input forming a differential input to receive signals at the first voltage level;
- a first output and a second output forming a differential output to provide output signals at the second voltage level;
- at least one capacitor coupled between the second output and the second voltage level to pull up the voltage level at the second output; and
- a first transistor connected between the first output and a voltage level less than the second voltage level to pull down the voltage level at the first output and a second transistor connected between the second output and the second voltage level to pull up the voltage level at the second output.

10. A level shifter for shifting a voltage level from a first voltage level to a second voltage level and having a predictable power-up state, the level shifter comprising:
- a first input and a second input forming a differential input to receive signals at the first voltage level;
- a first output and a second output forming a differential output to provide output signals at the second voltage level;
- at least one capacitor or transistor coupled between the second output and the second voltage level to pull up the voltage level at the second output; and
- a resistor connected between the first output and a voltage level less than the second voltage level to pull down the voltage level at the first output.

11. A level shifter for shifting a voltage level from a first voltage level to a second voltage level and having a predictable power-up state, the level shifter comprising:
- a first input and a second input forming a differential input to receive signals at the first voltage level;
- a first output and a second output forming a differential output to provide output signals at the second voltage level;
- at least one transistor coupled between the second output and the second voltage level to pull up the voltage level at the second output; and
- a first resistor connected between the first output and a voltage level less than the second voltage level to pull down the voltage level at the first output and a second capacitor connected between the second output and the second voltage level to pull up the voltage level at the second output.

12. A method for powering-up a level shifter for shifting a voltage level from a first voltage level to a second voltage level, the level shifter having a first input and a second input forming a differential input to receive signals at the first voltage level, and a first output and a second output forming a differential output to provide output signals at the second voltage level, the method comprising:
- providing a transistor coupled between the second output and the second voltage level to pull up the voltage level at the second output; and
- providing a first capacitor connected between the first output and a voltage level less than the second voltage level to pull down the voltage level at the first output and a second capacitor connected between the second output and the second voltage level to pull up the voltage level at the second output.

13. The method of claim 12, wherein the first output is a positive output of the differential output such that the level shifter powers-up in a low level state.

14. The method of claim 12, wherein the first output is a negative output of the differential output such that the level shifter powers-up in a high level state.

15. The method of claim 12, further comprising, during power-up, pulling the second output to a higher voltage level than the first output so that the level shifter powers-up in a desired state.

16. An input/output (I/O) interface of an integrated circuit having a reduced inrush current, the I/O interface configured to provide internal signals of the integrated circuit to at least one circuit external to the integrated circuit at voltage levels associated with the at least one external circuit, the I/O interface comprising:
- a plurality of I/O channels, each adapted to provide a respective internal signal at first voltage levels to the I/O interface at second voltage levels, each of the plurality of I/O channels comprising:
  - an I/O connection at which the at least one external circuit may connect to the respective I/O channel to receive signals at the second voltage levels;
  - at least one level shifter coupled to the I/O connection, the at least one level shifter including a first input and a second input forming a differential input to receive signals at the first voltage levels, and a first output and a second output forming a differential output to provide output signals at the second voltage levels to the I/O connection,
  - the at least one level shifter further comprising
    - a transistor between the second output and the second voltage level to pull up the voltage level at the second output, and
    - a first capacitor connected between the first output and a voltage level less than the second voltage level to pull down the voltage level at the first output and a second capacitor connected between the second output and the second voltage level to pull up the voltage level at the second output.

17. The I/O interface of claim 16, wherein each of the plurality of I/O channels includes a plurality of level shifters, each of the plurality of level shifters being coupled to the respective I/O connection through a respective switch such that when the respective level shifter is in a high level state, the switch is turned on and when the respective level shifter is in a low level state, the switch is turned off, and wherein the at least one circuit element of each of the plurality of level-shifters of each of the plurality of I/O channels is configured such that no two switches at any one of the plurality of I/O channels is on simultaneously during power-up.

18. The I/O interface of claim 17, wherein the at least one circuit element of each of the plurality of level-shifters of each of the plurality of I/O is configured such that none of the switches at any one of the plurality of I/O channels is on during power-up.

* * * * *